(12) United States Patent  
Higashi et al.

(10) Patent No.: US 7,084,510 B2  
(45) Date of Patent: Aug. 1, 2006

(54) SEMICONDUCTOR DEVICE AND METHOD OF MANUFACTURING THE SAME

(75) Inventors: Kazuyuki Higashi, Yokohama (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/765,833

(22) Filed: Jan. 29, 2004

(65) Prior Publication Data

US 2005/0093166 A1 May 5, 2005

(30) Foreign Application Priority Data

Oct. 31, 2003 (JP) .............................. 2003-372989

(51) Int. Cl.
*H01L 29/40* (2006.01)
*H01L 21/44* (2006.01)

(52) U.S. Cl. ...................................... 257/774; 438/687
(58) Field of Classification Search ................ 257/774; 438/607

See application file for complete search history.

(56) References Cited

U.S. PATENT DOCUMENTS 6,251,781 B1* 6/2001 Zhou et al. ................. 438/687
2002/0025675 A1* 2/2002 Chu et al. .................... 438/653

OTHER PUBLICATIONS

Norio Okada, et al., "Thermal Stress of 140nm-WIDTH Cu Damascene Interconnects", Preceedings of the International Interconnect Technology Conference, 2002, pp. 136-138.

* cited by examiner

*Primary Examiner*—Nathan J. Flynn
*Assistant Examiner*—Ben Sandvik
(74) *Attorney, Agent, or Firm*—Oblon, Spivak, McClelland, Maier & Neustadt, P.C.

(57) ABSTRACT

A semiconductor device has an active element structure formed on a semiconductor substrate. A first insulating film is provided above the semiconductor substrate. A first interconnect layer composed of copper is provided in a surface of the first insulating film. A second insulating film is provided on the first insulating film. A connection hole is formed in the second insulating film and has its bottom connected to the first insulating layer. A connection plug composed of a single crystal of copper is filled in the connection hole so that no other crystals of copper are provided in the connection hole. An interconnect trench is formed in a surface of the second insulating film and has its bottom connected to the connection hole. A second interconnect layer is provided in the interconnect trench.

13 Claims, 3 Drawing Sheets

SEMICONDUCTOR DEVICE AND METHOD OF MANUFACTURING THE SAME

CROSS REFERENCE TO RELATED APPLICATIONS

This application is based upon and claims the benefit of priority from the prior Japanese Patent Application No. 2003-372989, filed Oct. 31, 2003, the entire contents of which are incorporated herein by reference.

BACKGROUND OF THE INVENTION

1. Field of the Invention

The present invention relates to a semiconductor device, and for example, to a via and an interconnect structure in a semiconductor device having a multilayer interconnect structure.

2. Description of the Related Art

Recently, instead of Al (aluminum), used in the prior art, Cu (copper) has been used as a material for interconnects in a semiconductor device of a multilayer interconnect structure. The use of copper is based on demands for a reduction in interconnect resistance and the conduction of a large current through interconnects.

Copper interconnects have a high EM (Electro Migration) resistance but do not sufficiently resist SM (Stress Migration). The reason is as follows. First, as shown in FIG. 16, an interconnect layer 101 and a via 102 are formed by burying copper in a via hole (connection hole) and an interconnect trench, respectively. If copper is buried using a CVD (Chemical Vapor Deposition) method, a sputtering method, or the like, crystal grains of the copper deposited in the via hole and interconnect trench through their respective positions (their side, bottom surface, or the like) have different crystal orientations. Thus, a grain boundary is formed in the interface where these crystal grains meet. The state of the crystal grains is unstable in an area close to the grain boundary 103.

When the semiconductor device is thermally treated, the unstable crystal grains attempt to migrate to a stable position owing to heat applied to the interconnect. As a result, as shown in FIG. 17, a void 104 may be formed close to the area in which the grain boundary 103 was formed. In particular, the crystal grains in the via 102 tend to be smaller than the crystal grains in the interconnect layer 101. This means that a large number of unstable grains are present in the via 102. Defects are likely to result from SM caused by the void 104.

To avoid SM defects caused by the migration of crystal grains, several measures can be taken. First, it has been proposed that, as a material for the interconnect and the via, metal different from copper be added to copper. As a result, the migration of the crystal grains can be hindered to suppress the formation of a void. However, when copper is mixed with a different type of metal, the low-resistance characteristic of copper becomes insignificant to increase interconnect resistance.

Another possible technique suppresses the migration of crystal grains by improving the adhesion between copper and a barrier metal arranged on a side wall of the via hole. However, this technique is effective on crystal grains present close to the barrier metal but is ineffective on the interface, where crystal grains are most unstable. That is, it is unavoidable that a void is formed in the grain boundary.

BRIEF SUMMARY OF THE INVENTION

According to a first aspect of the present invention, there is provided a semiconductor device comprising: a semiconductor substrate; an active element structure formed on the semiconductor substrate; a first insulating film provided above the semiconductor substrate; a first interconnect layer provided in a surface of the first insulating film and composed of copper; a second insulating film provided on the first insulating film; a connection hole formed in the second insulating film and having a bottom connected to the first interconnect layer; a connection plug composed of a single crystal of copper filling the connection hole so that no other crystals of copper are provided in the connection hole; an interconnect trench formed in a surface of the second insulating film and having a bottom connected to the connection hole; and a second interconnect layer provided in the interconnect trench.

According to a second aspect of the present invention, there is provided a method of manufacturing a semiconductor device comprising: forming an active element structure on the semiconductor substrate; forming a first insulating film above the semiconductor substrate; forming an interconnect layer composed of copper in a surface of the first insulating film; forming a second insulating film on the first insulating film; forming a connection hole and an interconnect trench in the second insulating film, the connection hole having a bottom connected to the interconnect layer, the interconnect trench having a bottom connected to the connection hole; filling the connection hole with copper formed on the interconnect layer by epitaxial growth so as not to form any other crystals of copper in the connection hole; and filling the interconnect trench with copper.

DETAILED DESCRIPTION OF THE INVENTION

Embodiments of the present invention will be described below with reference to the drawings. In the description below, components having substantially the same functions (First Embodiment)

Figure 1:
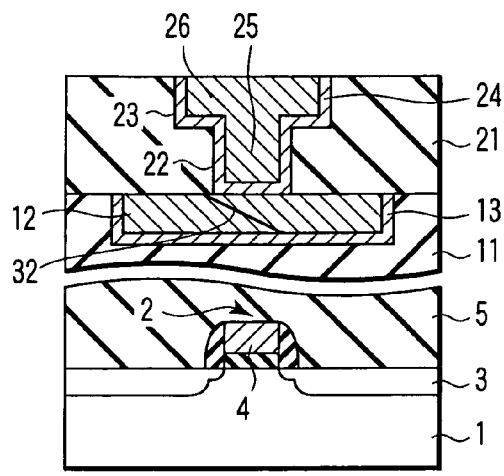
FIG. 1 is a sectional view schematically showing a semiconductor device according to a first embodiment of the present invention.

FIG. 1 is a sectional view schematically showing a semiconductor device according to a first embodiment of the present invention. FIG. 1 focuses on one layer of a semiconductor device of a multilayer interconnect structure and shows a structure including the periphery of this layer and a semiconductor substrate. As shown in FIG. 1, a transistor (active element structure) 2 is formed on a semiconductor substrate 1. The transistor 2 has a source/drain diffusion layer (connection region) 3 and a gate electrode 4 arranged on a gate insulating film (not shown). FIG. 1 illustrates the transistor as the active element structure formed on the semiconductor substrate. However, the present invention is not limited to this aspect. Any element structure may be used provided as long as it performs predetermined operations, produces predetermined effects, and has an electric connection region.

An interlayer insulating film 11 is provided above the semiconductor substrate 1. A low-dielectric-constant (low-k) material can be used for the interlayer insulating film 11 to reduce the capacities of interconnect layers in the interlayer insulating film 11. Specifically, the material may be, for example, siloxane, methylsilsesquioxane (MSQ), organic polymer, or a porous film made of these materials. The porous film means a film in which a large number of pores are formed. Moreover, a stacked film may be formed using any of these materials.

An interconnect layer 12 is formed on a surface of the interlayer insulating film 11. The interconnect layer 12 is composed of copper buried in an interconnect trench via a barrier metal 13.

An interlayer insulating film 21 is formed on the interlayer insulating film 11. A material that can be used as the interlayer insulating film 11 can be used for the interlayer insulating film 21. An interconnect layer 12 and a via hole 22 are formed in the interlayer insulating film 21. An interconnect trench 23 is formed in a surface of the interlayer insulating film 21 and is connected to the via hole 22 (connection hole).

A barrier metal 24 is provided on inner surfaces of the via hole 22 and interconnect trench 23. The barrier metal 24 comprises such a material and a thickness so that one of two films sandwiching the barrier metal 24 between them to take over the crystal orientation in the other. Specifically, a material for the barrier metal 24 is crystal-chemically similar to the two films (copper) sandwiching the barrier metal 24 between them or has an interatomic distance at the interface between this material and copper which is similar to that of the two films. More specifically, if the interconnect layer 12 is composed of copper, the material may be Ti (titanium), W (tungsten), Ta (tantalum), Nb (niobium), Al (aluminum), V (vanadium), Zr (zirconium), Ni (nickel), and their nitrides or oxides. Moreover, if any of these materials is used, its thickness is 0.1 to 1 nm.

Copper is buried in the via hole 22 and the interconnect trench 23 via the barrier metal 24. As a result, a via 25 and an interconnect layer 26 are formed. The copper in the via 25 is composed of a single crystal grain, and no other crystal grains are provided in the via hole 22. Furthermore, the copper in the via 25 has the same crystal orientation in any areas within the via hole 22. The crystal orientation of the copper in the via 25 is the same as a part of the interconnect layer 12 (hereinafter simply referred to as a "under via hole region") which is immediately below and close to the via hole 22. Here, the part close to the via hole 22 means an area located about 0.1 to 10 nm away from the via hole 22. By forming the barrier metal 24 under the above conditions, the crystal orientation in the interconnect layer 12 is taken over by the via 25 via the barrier metal 24. Since the via 25 is composed of the single crystal grain, no grain boundaries are formed in the via 25.

Figure 2:

Now, with reference to FIGS. 2 to 6, description will be given of a method of manufacturing a semiconductor device configured as described above. Description will be given only of the layer in which the interlayer insulating films 11 and 21 are located. As shown in FIG. 2, the transistor 2 is formed on the semiconductor substrate 1 using a known method. Then, the interlayer insulating film 11 is formed above the semiconductor substrate 1. An interconnect trench is then formed in the surface of the interlayer insulating film 11 by lithography and etching. Copper is buried in the interconnect trench via the barrier metal 13. Then, excessive copper on the interlayer insulating film 11 is removed by, for example, a CMP (Chemical Mechanical Polish) method to form the interconnect layer 12.

Figure 3:
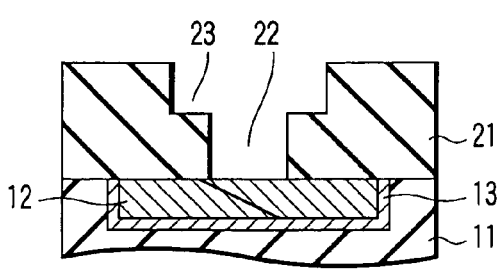

Then, as shown in FIG. 3, the interlayer insulating film 21 is formed on the interlayer insulating film 11. The via hole 22 and the interconnect trench 23 are formed by lithography and anisotropic etching such as RIE (Reactive Ion Etching).

Figure 4:
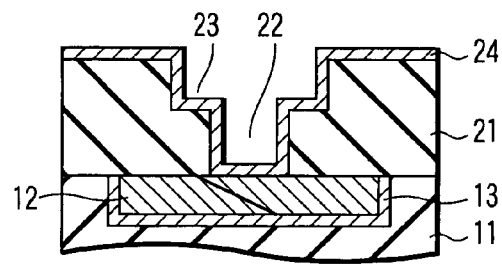
FIGS. 2, 3, 4, 5, and 6 are sectional views sequentially showing a part of a manufacturing process according to the first embodiment.

Then, as shown in FIG. 4, the barrier metal 24 is formed by, for example, a CVD method or an ALD (Atomic Layer Deposition) method so as to cover the inner surfaces of the via hole 22 and interconnect trench 23 as well as the interlayer insulating film 21. The ALD method is more desirable in terms of the ability to control thickness. Furthermore, the ALD method is more favorable because it allows the barrier metal 24 to grow epitaxially in a crystal orientation similar to that in a part of the interconnect layer 12 which is close to the via hole 22. When the barrier metal 24 is formed to be thin and have the same crystal orientation as the interconnect layer 12 at the bottom of the via hole 22, the via 25, formed in the subsequent step, can easily take over the crystal orientation in the interconnect layer 12.

Figure 5:
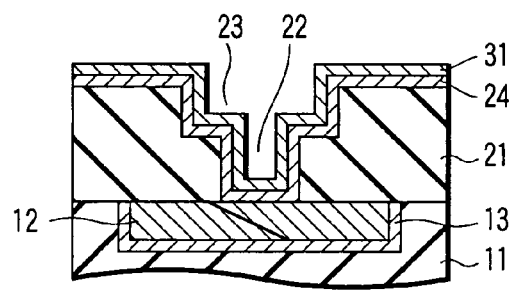

Then, as shown in FIG. 5, a seed film composed of copper is formed by, for example, the sputtering method or the CVD method so as to cover the inner surfaces of the via hole 22 and interconnect trench 23 as well as the interlayer insulating film 21. The seed film 31 functions as an electrode used to fill the via hole 22 by electroplating and as a base for epitaxial growth. The seed film 31 has a thickness of about 1 to 100 nm. The seed film 31 takes over, via the barrier metal 24, the crystal orientation in an area of the interconnect layer 12 which is below the via hole. It thus has the same crystal orientation as the area below the via hole. Furthermore, at least a part of the seed film 31 which corresponds to the bottom of the via hole 22 has the same crystal orientation in all the areas.

Figure 6:
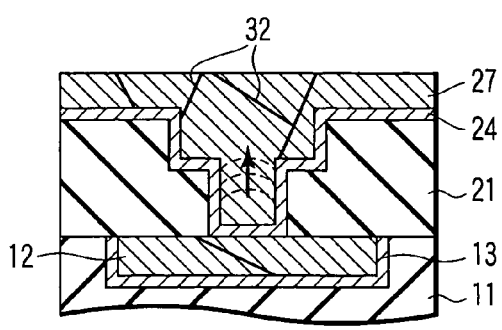

Then, as shown in FIG. 6, copper is buried in the via hole 22 by electroplating. At this time, the via hole 22 is filled under the conditions for the epitaxial growth of copper 27 from the bottom of the via hole 22. As a result, the copper 27 grows upward from the bottom of the via hole 22 with the same crystal orientation as the under via hole region of interconnect layer 12. Furthermore, after the via hole 22 has been filled, copper 27 is buried in the interconnect trench 23 during the same step. The copper in the interconnect trench 23 takes over the crystal orientation in the via 25. However, the copper 27 does not form a single crystal because the interconnect trench 23 is larger than a crystal grain of copper 27. That is, a grain boundary 32 is formed.

Then, as shown in FIG. 1, the excessive barrier metal 24 and copper 27 on the interlayer insulating film 21 are removed by the CMP method or the like.

According to the semiconductor device of the first embodiment of the present invention, in the structure in which copper is used as a material for the via 25, the via 25 is composed of a single crystal grain. Thus, the grain boundary 32 is not formed in the via 25. Since the grain boundary 32 is not formed, it is avoidable in the subsequent thermal treatment step that the crystal grain migrates from an area in which it is unstable to an area in which it is stable, so that no void is formed in the area in which the grain boundary 32 were present. It serves to avoid formation of the void which reduces the migration resistance and makes the semiconductor device less reliable.

According to the first embodiment, the barrier metal 24 between the interconnect layer 12 and the seed film 31 is constructed using such a material and a thickness as makes the crystal orientation in the seed film 31 the same as the interconnect layer 12. Thus, even if the barrier metal 24 is provided between the interconnect layer 12 and the seed film 31, the crystal orientation in the seed film 31 can be made the same as the under via hole area. It is then possible to form a via 25 composed of a single crystal and taking over the crystal orientation in the seed film 31.

(Second Embodiment)

In a second embodiment, the barrier metal 24 has an opening connected to the interconnect layer 12 at the bottom of the via hole 22.

Figure 7:
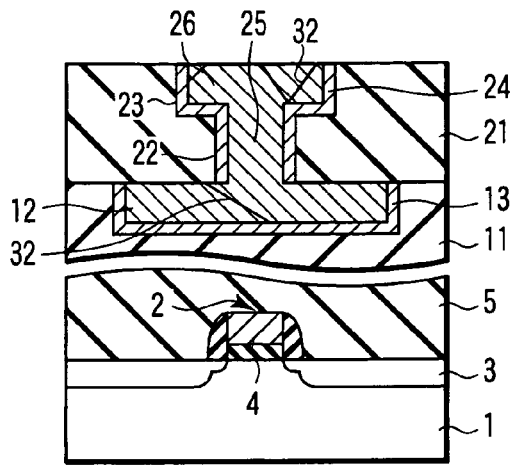
FIG. 7 is a sectional view schematically showing a semiconductor device according to a second embodiment of the present invention.

FIG. 7 is a sectional view schematically showing a semiconductor device according to the second embodiment of the present invention. As shown in FIG. 7, the barrier metal 24 is provided on the inner surfaces of the via hole 22 and interconnect trench 23. A part of the barrier metal 24 which corresponds to the bottom of the via hole 22 is removed. In the second embodiment, as described later, the crystal orientation in the via 25 is not taken over via the barrier metal 24 in contrast with the first embodiment. Accordingly, the thicknesses of the interconnect layer 12 and barrier metal 24 need not be limited to those described in the first embodiment. That is, these thicknesses may have any typical values.

Copper is buried in the via hole 22 and interconnect trench 23 via the barrier metal 24 to form the via 25 and the interconnect layer 26. The via 25 is connected directly to underlying interconnect layer 12. The crystal orientation in all the areas of the via 25 is the same as the under via hole area as in the case with the first embodiment.

Figure 8:
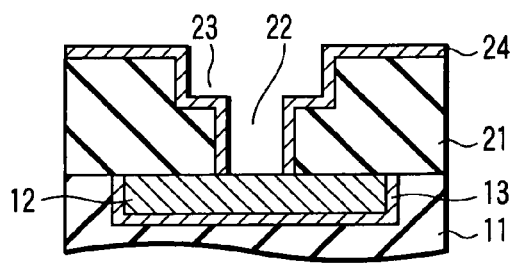

Now, with reference to FIGS. 8 to 10, description will be given of a method of manufacturing a semiconductor device configured as described above. Description will be given only of the layer in which the interlayer insulating films 11 and 21 are located. First, the same steps as the first embodiment are executed until the step shown in FIG. 3. Then, as shown in FIG. 8, the barrier metal 24 is formed by, for example, the CVD method, the ALD method, or the sputtering method so as to cover the inner surfaces of the via hole 22 and interconnect trench 23 as well as the interlayer insulating film 21. Then, for example, the RIE method or a process using an inert gas such as Ar (argon) is executed to remove the part of the barrier metal 24 which corresponds to the bottom of the via hole 22. As a result, the underlying interconnect layer 12 is exposed from the bottom of the via hole 22.

Figure 9:
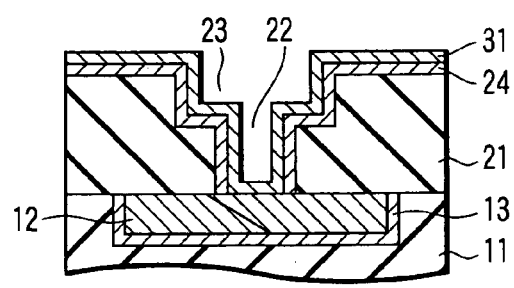

Then, as shown in FIG. 9, the seed film 31 is formed by, for example, the CVD method or the sputtering method so as to cover the inner surfaces of the via hole 22 and interconnect trench 23 as well as the interlayer insulating film 21. At least a part of the seed film 31 which is located on the interconnect layer 12 grows epitaxially and has the same crystal orientation as the under via hole area of the interconnect layer 12.

Figure 10:
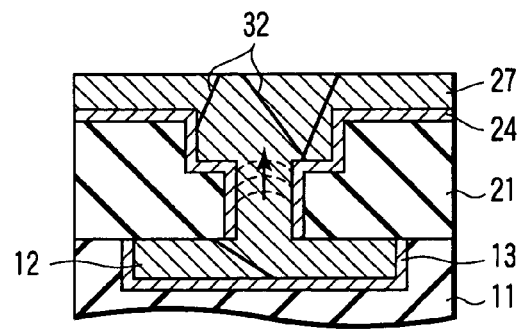
FIGS. 8, 9, and 10 are sectional views sequentially showing a part of a manufacturing process according to the second embodiment.

Then, as shown in FIG. 10, copper is buried in the via hole 22 by electroplating. At this time, the via hole 22 is filled under the conditions for the epitaxial growth of copper 27 from the bottom of the via hole 22, as in the case with the first embodiment. As a result, the copper 27 grows upward from the bottom of the via hole 22 with the same crystal orientation as the under via hole area of interconnect layer 12. Copper 27 is buried in the interconnect trench 23 during the same step.

Then, as shown in FIG. 7, the excessive barrier metal 24 and copper 27 on the interlayer insulating film 21 are removed by the CMP method or the like.

According to the second embodiment of the present invention, the copper in the via 25 is composed of a single crystal grain as in the case with the first embodiment. Thus, the second embodiment produces the same effects as the first embodiment. Furthermore, according to the second embodiment, the part of the barrier metal 24 which corresponds to the bottom of the via hole 22 is removed, with the copper of the via 25 formed directly on the underlying interconnect layer 12. Thus, the via 25 composed of a single crystal grain of copper can be formed regardless of the material and thickness of the barrier metal 24.

(Third Embodiment)

In a third embodiment, the via 25 is formed by electroless plating.

Figure 11:
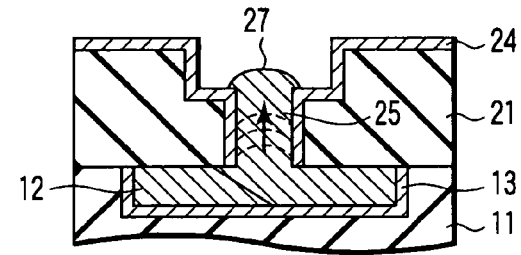
FIGS. 11 and 12 are sectional views sequentially showing a part of a manufacturing process according to a third embodiment of the present invention.
Figure 12:
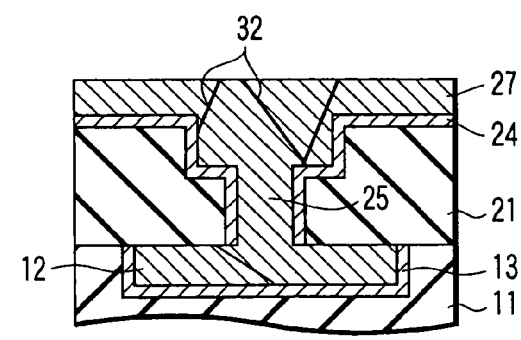

The sectional structure of a semiconductor device according to the third embodiment is the same as the second embodiment. With reference to FIGS. 11 and 12, description will be given of a method of manufacturing a semiconductor device according to the third embodiment. First, the same steps as the second embodiment are executed until the step shown in FIG. 8.

Then, as shown in FIG. 11, copper is buried in the via hole 22 by electroless plating. In the via hole 22, the copper 27 grows epitaxially upward from the bottom of the via hole 22, while taking over the crystal orientation in the under via hole area of the underlying interconnect layer 12. As a result, the via 25 is formed. After the via hole 22 has been filled with copper, the electroless plating is ended.

Then, as shown in FIG. 12, the via 25 is used as an electrode to bury copper 27 in the interconnect trench 23 by the electroplating method. Then, as shown in FIG. 7, the excessive barrier metal 24 and copper 27 on the interlayer insulating film 21 are removed by the CMP method or the like.

According to the third embodiment of the present invention, the via 25 is composed of a single crystal grain as in the case with the first embodiment. Thus, the third embodiment produces the same effects as the first embodiment. Furthermore, the part of the barrier metal 24 which corresponds to the bottom of the via hole 22 is removed, with the copper of the via 25 formed directly on the underlying interconnect layer 12. Thus, the third embodiment produces the same effects as the second embodiment.

(Fourth Embodiment)

In a fourth embodiment, the seed film 31 is formed only on the bottom surfaces of the interconnect trench 23 and via hole 22.

The sectional structure of a semiconductor device according to the fourth embodiment is similar to that of the first embodiment. However, the barrier metal 24 may have any typical thickness and may be composed as any typical material; the thickness and material described the first embodiment may also be used.

Figure 13:
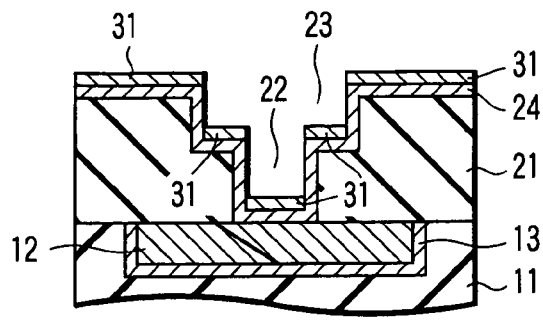
FIGS. 13, 14, and 15 are sectional views sequentially showing a part of a manufacturing process according to a fourth embodiment of the present invention.
Figure 16:
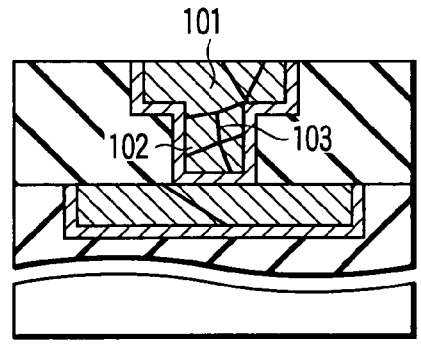
FIG. 16 is a sectional view showing a part of a conventional semiconductor device.
Figure 14:
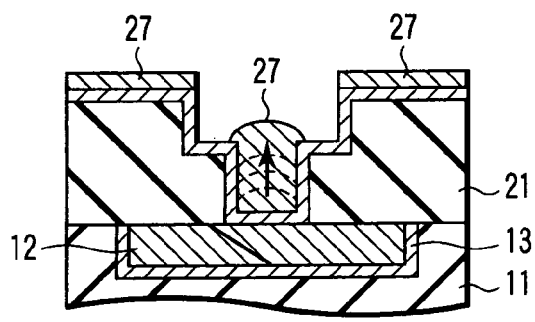
Figure 17:
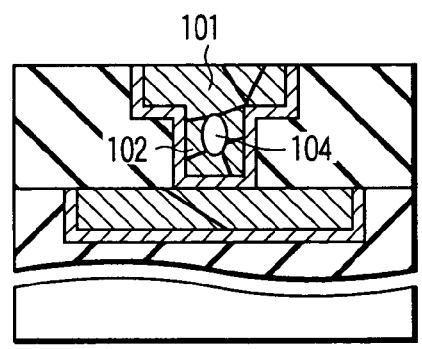
FIG. 17 is a view showing a problem of the conventional semiconductor device.

With reference to FIGS. 13 and 14, description will be given of a method of manufacturing a semiconductor device according to the fourth embodiment. First, the same steps as the first embodiment are executed until the step shown in FIG. 4.

Then, as shown in FIG. 13, for example, the CVD method or the sputtering method is used to form the seed film 31 in the via hole 22 and interconnect trench 23. At this time, the seed film 31 is formed only on the bottom surfaces of the via hole 22 and interconnect trench 23 by executing such control as increases the vertical component of sputtered grains. The seed film 31 is 1 to 100 nm in thickness. By forming the seed film 31 only at the bottom of the via hole 22 under the above conditions, the seed film 31 is composed of a single crystal grain. That is, the seed film 31 has a uniform crystal orientation. Therefore, the crystal orientation of the seed film 31 is independent of the crystal orientation of the underlying interconnect layer 13.

Figure 15:
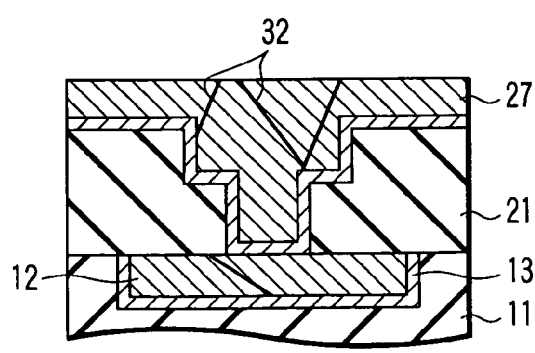

Then, as shown in FIG. 14, copper is epitaxially grown by electroless plating using the seed film 31 as a base point. As a result, as shown in FIG. 15, copper 27 is formed in the via hole 22 and interconnect trench 23 and on the interlayer insulating film 21 via the barrier metal 24. Then, as shown in FIG. 1, the excessive barrier metal 24 and copper 27 on the interlayer insulating film 21 are removed by the CMP method or the like to form the via 25 and the interconnect layer 26.

According to the fourth embodiment of the present invention, the via 25 is composed of a single crystal grain as in the case with the first embodiment. Thus, the fourth embodiment produces the same effects as the first embodiment. Furthermore, the seed film 31 of the predetermined thickness is formed only at the bottom of the via hole 22. Then, the via hole 22 is filled with copper growing epitaxially using the seed film 31 as a base. Thus, the via 25 composed of a single crystal grain of copper can be formed regardless of the material and thickness of the barrier metal 24.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an active element structure formed on the semiconductor substrate;
   a first insulating film provided above the semiconductor substrate;
   a first interconnect layer provided in a surface of the first insulating film and composed of copper;
   a second insulating film provided on the first insulating film;
   a connection hole formed in the second insulating film and having a bottom connected to the first interconnect layer;
   a connection plug composed of a single crystal of copper filling the connection hole so that no other crystals of copper are provided in the connection hole;
   an interconnect trench formed in a surface of the second insulating film and having a bottom connected to the connection hole; and
   a second interconnect layer provided in the interconnect trench and composed of a polycrystalline metal.

2. The device according to claim 1, further comprising a diffusion preventing metal film extending from a bottom of the connection hole to a side wall of the connection hole and an inner surface of the interconnect trench and composed of a material selected from a group consisting of Ti, W, Ta, Nb, Al, V, Zr, Ni, and their nitrides and oxides, the diffusion preventing film having a thickness of 0.1 to 1 nm.

3. The device according to claim 1, further comprising a diffusion preventing metal film provided on a inner surface of the connection hole and having an opening reaching the first interconnect layer at the bottom of the connection hole, the diffusion preventing metal film being composed of a material different from copper.

4. The device according to claim 3, wherein the diffusion preventing metal film is composed of a material selected from a group consisting of Ti, W, Ta, Nb, Al, V, Zr, Ni, and their nitrides and oxides.

5. The device according to claim 1, wherein the copper of the connection plug has the same crystal orientation as that in a part of the first interconnect layer which is located immediately below and close to the connection hole in the first interconnect layer.

6. The device according to claim 3, wherein the copper of the connection plug has the same crystal orientation as that in a part of the first interconnect layer which is located immediately below and close to the connection hole in the first interconnect layer.

7. A method of manufacturing a semiconductor device comprising:
   forming an active element structure on the semiconductor substrate;
   forming a first insulating film above the semiconductor substrate;
   forming an interconnect layer composed of copper in a surface of the first insulating film;
   forming a second insulating film on the first insulating film;
   forming a connection hole and an interconnect trench in the second insulating film, the connection hole having a bottom connected to the interconnect layer, the interconnect trench having a bottom connected to the connection hole;
   filling the connection hole with a single crystal copper formed on the interconnect layer by epitaxial growth so as not to form any other crystals of copper in the connection hole; and
   filling the interconnect trench with polycrystalline copper.

8. The method according to claim 7, further comprising:
   after forming the connection hole and before filling the connection hole,
   forming a diffusion preventing metal film covering inner surfaces of the connection hole and interconnect trench and composed of a material selected from a group consisting of Ti, W, Ta, Nb, Al, V, Zr, Ni, and their nitrides and oxides, the diffusion preventing film having a thickness of 0.1 to 1 nm; and forming a base film composed of copper, on the diffusion preventing metal film.

9. The method according to claim 8, wherein filling the connection hole includes forming the copper by an electroplating method using the base film as a base.

10. The method according to claim 7, wherein filling the connection hole includes:
  forming a base film composed of copper, on the interconnect layer at the bottom of the connection hole; and
  forming the copper by an electroplating method using the base film as a base.

11. The method according to claim 7, wherein filling the connection hole includes forming the copper by an electroless plating method using the interconnect layer as a base.

12. The method according to claim 7, further comprising:
  after forming the connection hole and before filling the connection hole,
  forming a diffusion preventing metal film covering inner surfaces of the connection hole and interconnect trench and composed of a material different from copper; and
  removing the diffusion preventing metal film from the bottom of the connection hole.

13. The method according to claim 7, wherein filling the connection hole includes:
  forming a diffusion preventing metal film at the bottom of the connection hole, the diffusion preventing metal film being composed of a material different from copper;
  forming a base film composed of copper, on the diffusion preventing metal film; and
  forming the copper by an electroless plating method using the base film as a base.

* * * * *